United States Patent
Koike et al.

(10) Patent No.: US 6,680,957 B1
(45) Date of Patent: Jan. 20, 2004

(54) GROUP III NITRIDE COMPOUND SEMICONDUCTOR LASER

(75) Inventors: Masayoshi Koike, Aichi-ken (JP); Shiro Yamasaki, Aichi-ken (JP); Yuta Tezen, Aichi-ken (JP); Seiji Nagai, Aichi-ken (JP); Akira Kojima, Aichi-ken (JP); Toshio Hiramatsu, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 09/515,493

(22) Filed: Feb. 29, 2000

(30) Foreign Application Priority Data

Mar. 8, 1999 (JP) .............................. 11-059987

(51) Int. Cl.$^7$ ................................. H01S 5/00
(52) U.S. Cl. ............................. 372/43; 372/45
(58) Field of Search .................... 257/96; 148/DIG. 3; 372/45, 44, 43

(56) References Cited

U.S. PATENT DOCUMENTS

| | | | |
|---|---|---|---|
| 5,604,763 A | * 2/1997 | Kato et al. ...................... | 372/45 |
| 5,751,752 A | * 5/1998 | Shakuda ........................ | 257/96 |
| 5,834,331 A | * 11/1998 | Razeghi ................. | 148/DIG. 3 |
| 5,889,806 A | * 3/1999 | Nagai et al. .................. | 372/44 |
| 5,966,396 A | * 10/1999 | Okazaki et al. ............... | 372/46 |
| 6,115,399 A | * 9/2000 | Shakuda ........................ | 372/45 |
| 6,252,894 B1 | * 6/2001 | Sasanuma et al. ............. | 372/45 |

FOREIGN PATENT DOCUMENTS

| | | |
|---|---|---|
| JP | 11-145566 | 5/1999 |
| JP | 11-261158 | 9/1999 |
| JP | 11-266058 | 9/1999 |

* cited by examiner

*Primary Examiner*—Paul Ip
*Assistant Examiner*—Hung T Vy
(74) *Attorney, Agent, or Firm*—McGinn & Gibb, PLLC

(57) ABSTRACT

A semiconductor laser 101 comprises a sapphire substrate 1, an AlN buffer layer 2, Si-doped GaN n-layer 3, Si-doped $Al_{0.1}Ga_{0.9}N$ n-cladding layer 4, Si-doped GaN n-guide layer 5, an active layer 6 having multiple quantum well (MQW) structure in which about 35 Å in thickness of GaN barrier layer 62 and about 35 Å in thickness of $Ga_{0.95}In_{0.05}N$ well layer 61 are laminated alternately, Mg-doped GaN p-guide layer 7, Mg-doped $Al_{0.1}Ga_{0.9}N$ p-cladding layer 8, and Mg-doped GaN p-contact layer 9 are formed successively thereon. A ridged hole injection part B which contacts to a ridged resonator part A is formed to have the same width as the width w of an Ni electrode 10. Holes transmitted from the Ni electrode 10 are injected to the active layer 6 with high current density, and electric current threshold for laser oscillation can be decreased. Electric current threshold can be improved more effectively by forming also the p-guide layer 7 to have the same width as the width w of the Ni electrode 10.

21 Claims, 6 Drawing Sheets

US 6,680,957 B1

GROUP III NITRIDE COMPOUND SEMICONDUCTOR LASER

BACKGROUND OF THE INVENTION

1. Field of the invention

The present invention relates to a group III nitride compound semiconductor laser. Especially, the present invention relates to a group III nitride compound semiconductor laser having a resonator part of ridge type.

2. Description of the Related Art

A semiconductor laser which has a cladding layer and an active layer made of a group III nitride compound semiconductor ($Al_xGa_yIn_{1-x-y}N$, $0 \leq x \leq 1$, $0 \leq y \leq 1$ and $0 \leq x+y \leq 1$) has been known. The conventional semiconductor laser is a semiconductor diode having multi-layer structure with multiple group III nitride compound semiconductor layers, which are formed on a sapphire substrate in sequence. A conventional example of the semiconductor diode is shown in FIG. 5.

A semiconductor laser 900 shown in FIG. 5 has the following eight layers formed on a sapphire substrate 91 in sequence: a buffer layer 92; an n-layer 93; an n-cladding layer 94; an n-guide layer 95; an active layer 96 made of multiple quantum well (MQW) layer; a p-guide layer 97; a p-cladding layer 98; and a p-contact layer 99. As shown in FIG. 5, a resonator part (a ridged resonator part) A is formed by using, e.g., photoresist and etching, and a positive electrode 901 and a negative electrode 902 are formed on the upper surface of the p-contact layer 99 and the etched surface of the n-layer 93, respectively.

The active layer 96, comprising a multiple quantum well (MQW) layer, is a semiconductor layer which functions as a main layer to oscillate laser. Each carriers (holes and electrons) injected from the positive electrode 901 and the negative electrode 902 combine in the active layer 96, that causes laser oscillation. The n-guide layer 95 and the p-guide layer 97 cannot prevent carriers from injecting into the active layer 96, but function to confine laser light into the active layer 96 by using refractive index difference between the active layer 96 and each of the n-guide layer 95 and the p-guide layer 97. Also, the n-cladding layer 94 and the p-cladding layer 98 function as electric potential barrier, so that they can accumulate injected carriers (holes and electrons) in the n-guide layer 95, the active layer 96 and the p-guide layer 97. And the n-layer 93 and the p-contact layer 99 are semiconductor layers which are formed in order that carriers can be injected smoothly from the negative electrode 902 and the positive electrode 901 to the layers existing between the n-cladding layer 94 and the p-cladding layer 98, respectively.

In order that the semiconductor laser made of group III nitride compound semiconductor can oscillate laser efficiently, the cross-section of electric current path of the semiconductor laser is, for example, narrowed by decreasing the contact area of electrodes, or by decreasing the width w of the positive electrode 901. And in order to narrow the cross-section of the electric current path, the p-cladding layer 98 is etched to about half a thickness of the original. Also, a carrier injection part (a ridged hole injection part) B is formed by removing the upper part of the ridged resonator part A to have the same width as that of the electrode 901, as shown in FIG. 6.

However, a threshold electric current to oscillate laser cannot be decreased by forming the ridged hole injection part B. The inventors of the present invention consider that as shown in FIG. 6, this is because holes $h^+$ diffuse in a lateral direction to enlarge the width of the cross-section of the current path larger than the width of the ridged hole injection part B, i.e., the width w of the positive electrode 901, when holes $h^+$ existing in the p-cladding layer 98 conducts from the ridged hole injection part B to the ridged resonator part. The inventors of the present invention further consider that the problem persists in the current density can be solved by etching to form a deeper ridged hole injection part B.

SUMMARY OF THE INVENTION

An object of the present invention is to decrease oscillation threshold current in a ridge type of a group III nitride compound semiconductor laser. Another object of the present invention is to increase the difference of the effective refractive indices of the ridged resonator part and the other part.

To achieve the above object, a first aspect of the present invention is to obtain a group III nitride compound semiconductor laser comprising a resonator. The resonator is formed by removing multiple layers, which are made of group III nitride compound semiconductors and formed on a substrate, except the width of the resonator part. The group III nitride compound semiconductor laser comprises: an active layer which functions as a main layer to oscillate laser; a first and a second guide layers contacting to the active layer; a cladding layer which contacts to the opposite surface of the first guide layer to the active layer; a contact layer which contacts to the opposite surface of the cladding layer to the first guide layer; and an electrode formed on the contact layer. A carrier injection part is formed contacting to the resonator part by removing almost all of the contact layer and the cladding layer except the area corresponding to the width of an electrode.

The second aspect of the present invention is to obtain a group III nitride compound semiconductor laser comprising a resonator. The resonator is formed by removing multiple layers, which are made of group III nitride compound semiconductors and formed on a substrate, except the width of the resonator part. The group III nitride compound semiconductor laser comprises: an active layer which functions as a main layer to oscillate laser; a first and a second guide layers contacting to the active layer; a cladding layer which contacts to the opposite surface of the first guide layer to the active layer; a contact layer which contacts to the opposite surface of the cladding layer to the first guide layer; and an electrode formed on the contact layer. A carrier injection part is formed contacting to the resonator part by removing almost all of the contact layer and the cladding layer and at least a partial depth of the first guide layer except the area corresponding to the width of an electrode.

The third aspect of the present invention is to remove almost all of the contact layers and the cladding layers made of group III nitride compound semiconductors, formed on the side of a positive electrode. And the fourth aspect is to additionally remove till at least a partial depth of the first guide layer.

With respect to a ridge type of laser, carriers can be supplied to an active layer with improved current density by removing all of a contact layer and a cladding layer, which are formed on the side to form an electrode, except the area corresponding to the width of the electrode, and forming a carrier injection part. And carriers can be supplied to the active layer with further improved current density by removing all of the contact layer and the cladding layer, which are formed on the side to form the electrode, except the area corresponding to the width of the electrode, and by further removing at least a partial depth of a guide layer which is also formed on the side to form the electrode. A group III nitride compound semiconductor laser is etched more frequently from a positive electrode side. So current density of holes injected into the active layer can be improved effectively.

BRIEF DESCRIPTION OF THE DRAWINGS

Other objects, features, and characteristics of the present invention will become apparent upon consideration of the following description and the appended claims with reference to the accompanying drawings, all of which form a part of the specification, and wherein reference numerals designate corresponding parts in the various figures wherein:

DETAILED DESCRIPTION OF THE PREFERRED EMBODIMENTS

The present invention will be described hereinbelow with reference to specific embodiments. In FIGS. 1A, 1B, 2, and 3, an identical number is given to each layers having the same function, which is made of group III nitride compound semiconductor.

Figure 1:
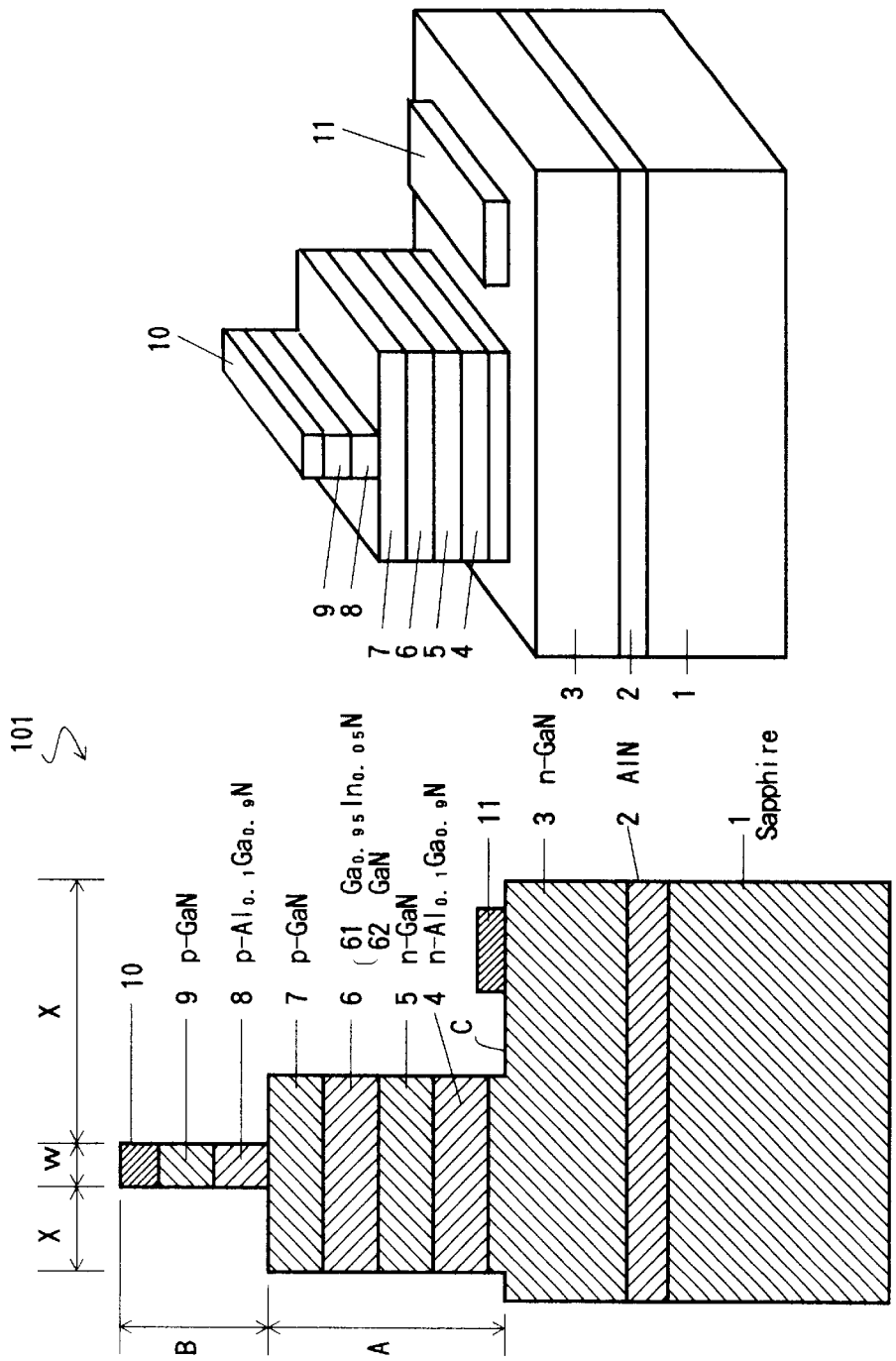
FIG. 1A is a sectional view of a semiconductor laser 101 in accordance with the first embodiment of the present invention.
FIG. 1B is a view showing a structure of the semiconductor laser 101 in accordance with the first embodiment of the present invention.
Figure 2:
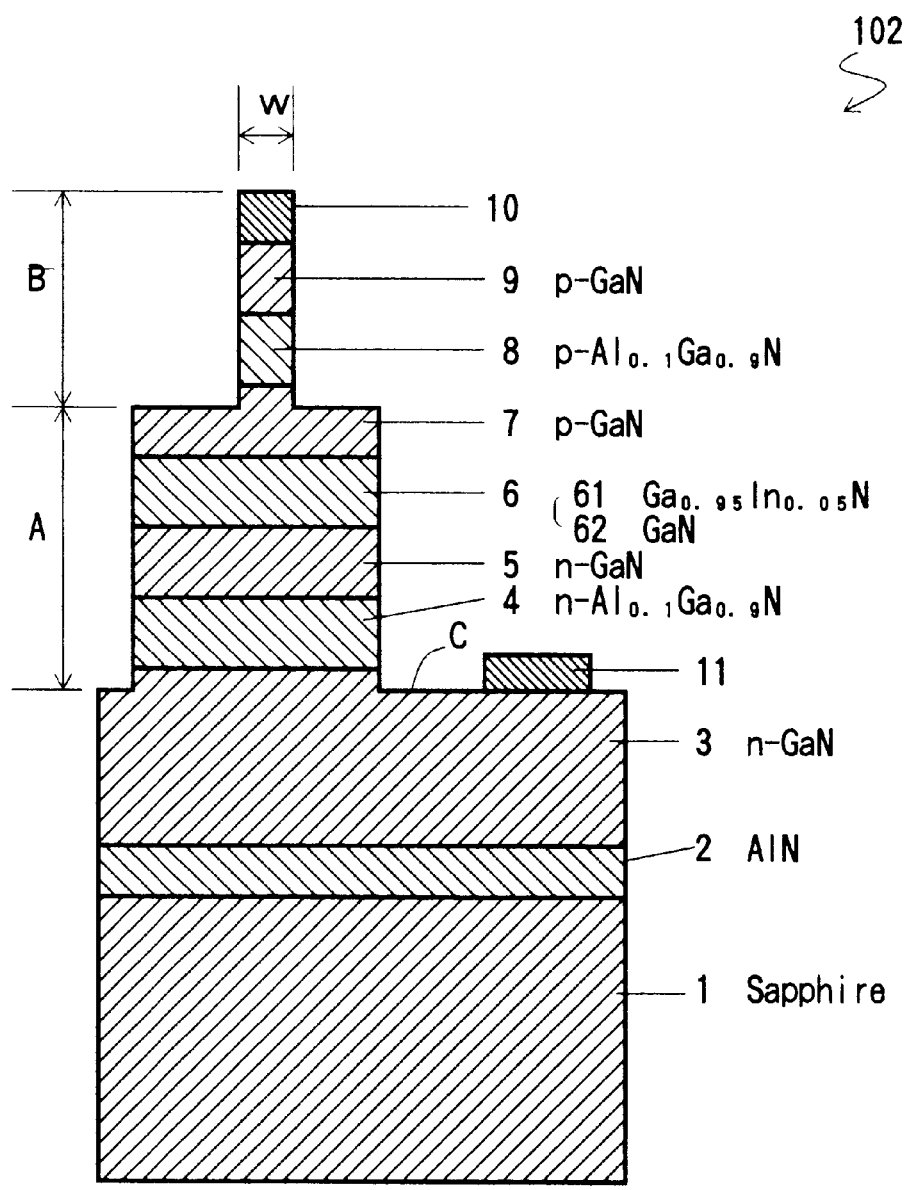
FIG. 2 is a sectional view of a semiconductor laser 102 in accordance with the second embodiment of the present invention.

FIG. 1A and FIG. 2 illustrate sectional views of semiconductor lasers 101 and 102, respectively. FIG. 1B illustrates a view showing a structure of the semiconductor laser 101.

Each of the semiconductor lasers 101 and 102 has a sapphire substrate 1, and an AlN buffer layer 2 having a thickness of 50 nm is formed on the substrate 1. Alternatively, the buffer layer 2 can be made of GaN or AlGaN. Oh the buffer layer 2, the following layers are formed consecutively: about 4.0 µm in thickness of silicon (Si) doped gallium nitride (GaN) n-layer 3, having an electron concentration of $1\times10^{18}/cm^{-3}$; 500 nm in thickness of Si-doped $Al_{0.1}Ga_{0.9}N$ n-cladding layer 4, having an electron concentration of $1\times10^{18}/cm^{-3}$; 100 nm in thickness of Si-doped GaN n-guide layer 5, having an electron concentration of $1\times10^{18}/cm^{-3}$; and an active layer 6 having multiple quantum well (MQW) structure in which about 35 Å in thickness of GaN barrier layer 62 and about 35 Å in thickness of $Ga_{0.95}In_{0.05}N$ well layer 61 are laminated alternately. And 100 nm in thickness of magnesium (Mg) doped GaN p-guide layer 7, having a hole concentration of 5 $\times10^{17}/cm^{-3}$, 500 nm in thickness of Mg-doped $Al_{0.1}Ga_{0.9}N$ p-cladding layer 8, having a hole concentration of $5\times10^{17}/cm^{-3}$, and 200 nm in thickness of Mg-doped GaN p-contact layer 9, having a hole concentration of $5\times10^{17}/cm^{-3}$, are formed successively thereon. Then 5 µm in width of an electrode 10 made of nickel (Ni) is formed on the p-contact layer 9, and an electrode 11 made of aluminum (Al) is formed on the n-layer 3.

The ridged hole injection part B, which contacts to the ridged resonator part A of the semiconductor lasers 101 and 102, is formed to have a width of about 5 µm, which is the width w of the Ni electrode 10. The ridged hole injection part B of the semiconductor laser 101 comprises the Ni electrode 10, the p-contact layer 9 and the p-cladding layer 8. And the ridged resonator part A does not comprise the p-cladding layer 8. The ridged hole injection part B of the semiconductor laser 102 comprises the Ni electrode 10, the p-contact layer 9, the p-cladding layer 8 and a part layer of the upper 50 nm in thickness of the p-guide layer 7. The ridged resonator part A of the laser 102 comprises a part layer of the lower 50 nm in thickness of the p-guide layer 7.

A method for manufacturing the semiconductor laser 101 is explained hereinafter. Each of the layers of the semiconductor laser 101 is formed by gaseous phase epitaxial growth, called metal organic vapor phase deposition (hereinafter MOVPE). The gases employed in this process were ammonia ($NH_3$), a carrier gas ($H_2$ or $N_2$), trimethyl gallium ($Ga(CH_3)_3$) (hereinafter TMG.), trimethyl aluminum ($Al(CH_3)_3$) (hereinafter TMA), trimethyl indium (In $(CH_3)_3$) (hereinafter TMI), silane ($SiH_4$), and biscyclopentadienyl magnesium ($Mg(C_5H_5)_2$) (hereinafter $CP_2Mg$).

The single crystalline sapphire substrate 1 was placed on a susceptor in a reaction chamber for the MOVPE treatment after its main surface 'a' was cleaned by an organic washing solvent and heat treatment. Then the sapphire substrate 1 was baked for about 30 min. at 1100° C. by $H_2$ vapor fed into the chamber at a flow rate of 2 L/min. under normal pressure.

About 50 nm in thickness of AlN buffer layer 2 was formed on the surface 'a' of the baked sapphire substrate 1 under conditions controlled by lowering the temperature in the chamber to 400° C., keeping the temperature constant, and concurrently supplying $H_2$ at a flow rate of 20 L/min., $NH_3$ at 10 L/min., and TMA at 18 µmol/min. for about 90 seconds.

About 4.0 µm in thickness of Si-doped GaN was formed on the buffer layer 2, as an n-layer 3 with an electron concentration of $1\times10^{18}cm^{-3}$, under conditions controlled by keeping the temperature of the sapphire substrate 1 at 1150° C. and concurrently supplying $H_2$ at a flow rate of 20 L/min., $NH_3$ at 10 L/min., TMG at 170 µmol/min., and silane ($SiH_4$) diluted to 0.86 ppm by $H_2$ at 2 nmol/min.

About 500 nm in thickness of Si-doped $Al_{0.1}Ga_{0.9}N$ was formed on the n-layer 3, as an n-cladding layer 4 with an electron concentration of $1\times10^{18}cm^{-3}$, under conditions controlled by keeping the temperature of the sapphire substrate 1 at 1100° C. and concurrently supplying $H_2$ at a flow rate of 20 L/min., $NH_3$ at 10 L/min., TMA at 5 µmol/min., TMG at 50 µmol/min., and silane ($SiH_4$) diluted to 0.86 ppm by $H_2$ at 8 nmol/min.

About 100 nm in thickness of Si-doped GaN was formed on the n-cladding layer 4, as an n-guide layer 5 with an electron concentration of $1\times10^{18}cm^{-3}$, under conditions controlled by keeping the temperature of the sapphire substrate 1 at 1100° C. and concurrently supplying $H_2$ at a flow rate of 20 L/min., TMG at 50 µmol/min., and silane ($SiH_4$) diluted to 0.86 ppm by $H_2$ at 8 nmol/min., About 35 Å in thickness of GaN was formed on the n-guide layer 5, as a barrier layer 62, concurrently supplying $N_2$ or $H_2$, $NH_3$ and TMG. About 35 Å in thickness of $Ga_{0.95}In_{0.05}N$ was formed on the barrier layer 62, as a well layer 61, concurrently supplying $N_2$ or $H_2$, $NH_3$, TMG and TMI. Then about 35 Å in thickness of GaN was formed on the well layer 61, as a barrier layer 62, concurrently supplying $N_2$ or $H_2$, $NH_3$ and TMG. Similarly, four pairs of the well layer 61 and the barrier layer 62 were formed in sequence under the same respective conditions. Accordingly, an active layer 6 having a multiple quantum well (MQW) structure was formed.

About 100 nm in thickness of Mg-doped GaN was formed on the active layer 6, as a p-guide layer 7, under conditions controlled by keeping the temperature of the sapphire substrate 1 to 1100° C., concurrently supplying $N_2$ or $H_2$ at a flow rate of 20 L/min., $NH_3$ at a flow rate of 10 L/min., TMG at 50 μmol/min., and $Cp_2Mg$ at 0.2 μmol/min.

About 500 nm in thickness of Mg-doped $Al_{0.1}Ga_{0.9}N$ was formed on the p-guide layer 7, as a p-cladding layer 8, under conditions controlled by keeping the temperature of the sapphire substrate 1 to 1100° C., concurrently supplying $N_2$ or $H_2$ at a flow rate of 20 L/min., $NH_3$ at a flow rate of 10 L/min., TMA at 5 μmol/min., TMG at 50 μmol/min., and $Cp_2Mg$ at 0.2 μmol/min.

About 200 nm in thickness of Mg-doped GaN was formed on the p-cladding layer 8, as a p-contact layer 9, under conditions controlled by keeping the temperature of the sapphire substrate 1 to 1100° C., concurrently supplying $N_2$ or $H_2$ at a flow rate of 20 L/min., $NH_3$ at a flow rate of 10 L/min., TMG at 50 μmol/min., and $Cp_2Mg$ at 0.2 μmol/min.

Then, electron rays were uniformly irradiated into the three layers, or the p-contact layer 9, the p-cladding layer 8 and the p-guide layer 7, using a reflective electron beam diffraction device. The irradiation conditions were set at 10 kV for the accelerating voltage, 1 μA for the sample current, 0.2 mm/s. for the speed of the beam scanning, 60 μm φ for the beam aperture, and at 50 μTorr vacuum. This irradiation cause to increase hole concentrations of three layers, or the p-contact layer 9, the p-cladding layer 8 and the p-guide layer 7, the respective hole concentrations are $5\times10^{17}cm^{-3}$, $5\times10^{17}cm^{-3}$ and $5\times10^{17}cm^{-3}$. As a result, a wafer with a multiple layer structure was obtained.

About 200 nm in thickness of $SiO_2$ layer was formed on the p-contact layer 9 by sputtering, and a photoresist layer was laminated on the $SiO_2$ layer. The photoresist layer of the other part except the ridged hole injection part B, or region X shown in FIG. 1A, was removed by using photolithography. And the $SiO_2$ layer, which is not covered by the photoresist layer, was removed by using hydrofluoric acid system etching solution.

The portion of the p-layer 9 and the p-cladding layer 8, which is not covered by the photoresist layer and the $SiO_2$ layer, is dry-etched under conditions set at 0.04 Torr vacuum and at 0.44 W/cm² for a high-frequency power, concurrently supplying $BCl_3$ gas at a flow late of 10 mL/min. Accordingly, the ridged hole injection part B as shown in FIG. 1B was formed. Then the $Sio_2$ layer was removed.

In order to form an electrode 11, region C was formed on a portion of the n-layer 3 as follows. The $SiO_2$ layer having a thickness of 200 nm was formed by carrying out sputtering, which was covered by a photoresist layer. A portion of the photoresist layer, or a portion to form region C, was removed by using photolithography. Then the $siO_2$ layer, which is not covered by the photoresist layer, was removed by using hydrofluoric acid system etching solution.

The p-guide layer 7, the active layer 6, the n-guide layer 5, the n-cladding layer 4 and a portion of the n-layer 3, which are not covered by the photoresist layer and the $SiO_2$ layer, is dry-etched under conditions set at 0.04 Torr vacuum and at 0.44 W/cm² for a high-frequency power, concurrently supplying $BCl_3$ gas at a flow late of 10 mL/min, and then dry-etched by argon (Ar) gas. Accordingly, region C shown in FIG. 1A was formed. After that the $SiO_2$ layer was removed.

Nickel (Ni) was deposited uniformly on the semiconductor laser 101. A photoresist layer was laminated on the Ni layer. And after removing processes using photolithography and etching, the electrode 10 having a width of 5 μm was formed on the p-contact layer 9. Aluminum (Al) was deposited on the n-layer 3, and the electrode 11 was formed.

The semiconductor laser 102 having the same structure as that of the semiconductor laser 101, as shown in FIG. 2, was manufactured by the same process as that of the semiconductor laser 101, except that the p-contact layer 9, the p-cladding layer 8 and the part layer of the upper 50 nm in thickness the p-guide layer 7 was dry-etched in the etching process to form the ridged hole injection part B.

Accordingly, the semiconductor lasers 101 and 102 as shown in FIGS. 1A, 1B and 2 were obtained. As shown in FIG. 1A, the semiconductor laser 101 has the ridged hole injection part B which was formed by etching all the semiconductor layers, or the p-contact layer 9 and the p-cladding layer 8, except the width of the ridged hole injection part B. And as shown in FIG. 2, the semiconductor laser 102 has the ridged hole injection part B which was formed by etching the semiconductor layers, or all of the p-contact layer 9 and the p-cladding layer 8 and the p-guide layer 7 leaving the part layer of the lower 50 nm in thickness, except the width of the ridged hole injection part B.

Figure 3:
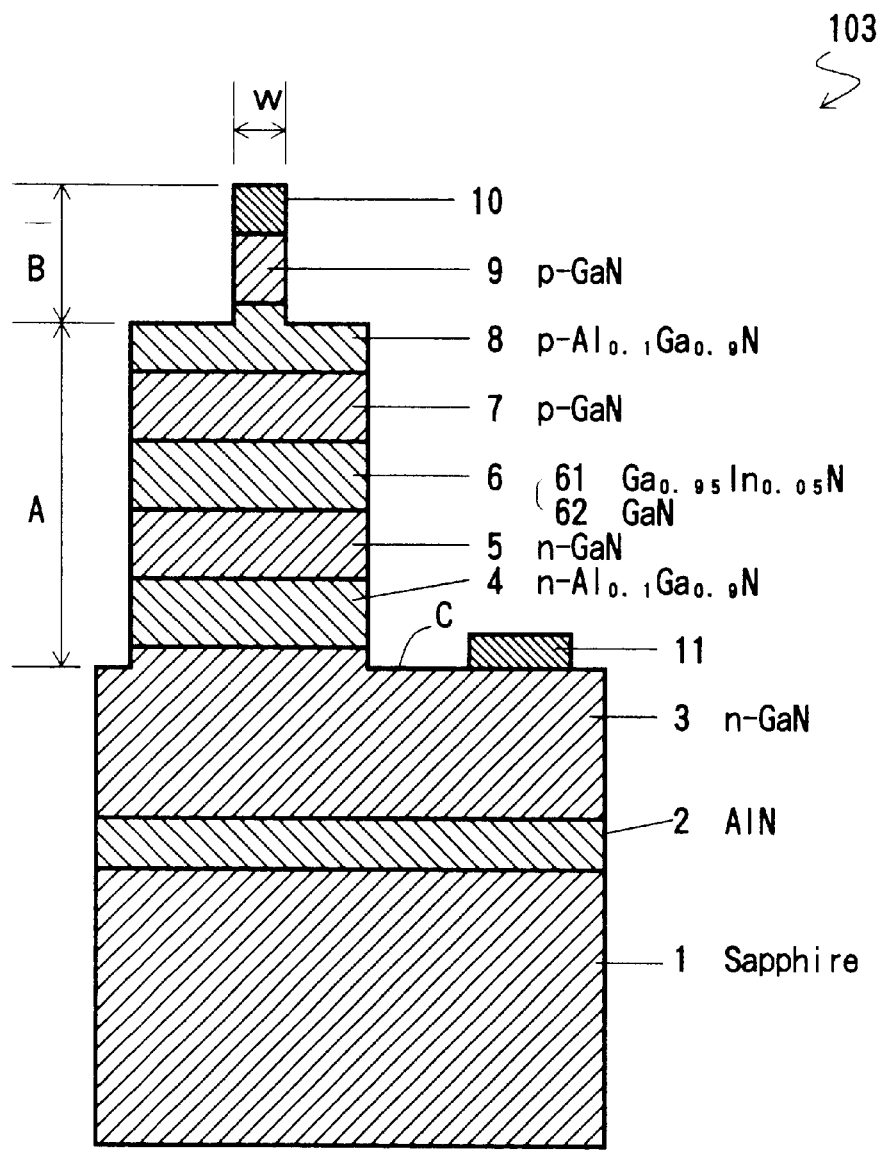
FIG. 3 is a sectional view of a semiconductor laser 103 in accordance with a comparative example.

For comparison, a semiconductor laser 103 was formed as shown in FIG. 3. The semiconductor laser 103 has a ridged hole injection part B which was formed by etching the semiconductor layers, or all of the p-contact layer 9 and the p-cladding layer 8 leaving the part layer of the lower 50 nm in thickness, except the width of the ridged hole injection part B, by etching. The semiconductor laser 103, having the same structure as those of the semiconductor lasers 101 and 102, as shown in FIG. 3, was manufactured by the same process as those of the semiconductor lasers 101 and 102, exclusive of the depth of etching to form the ridged hole injection part B.

The total height of the ridged resonator part A plus the ridged hole injection part B becomes equal in all the semiconductor lasers 101, 102 and 103, which are shown in FIGS. 1, 2 and 3. The height of the ridged resonator A formed in the semiconductor laser 102 is 50 nm higher than that of the semiconductor laser 101, or the first etching of the semiconductor laser 102 is 50 nm deeper than that of the semiconductor laser 101. The height of the ridged resonator A formed in the semiconductor laser 101 is 50 nm higher than that of the semiconductor laser 103, or the first etching of the semiconductor laser 101 is 50 nm deeper than that of the semiconductor laser 103.

Figure 4:
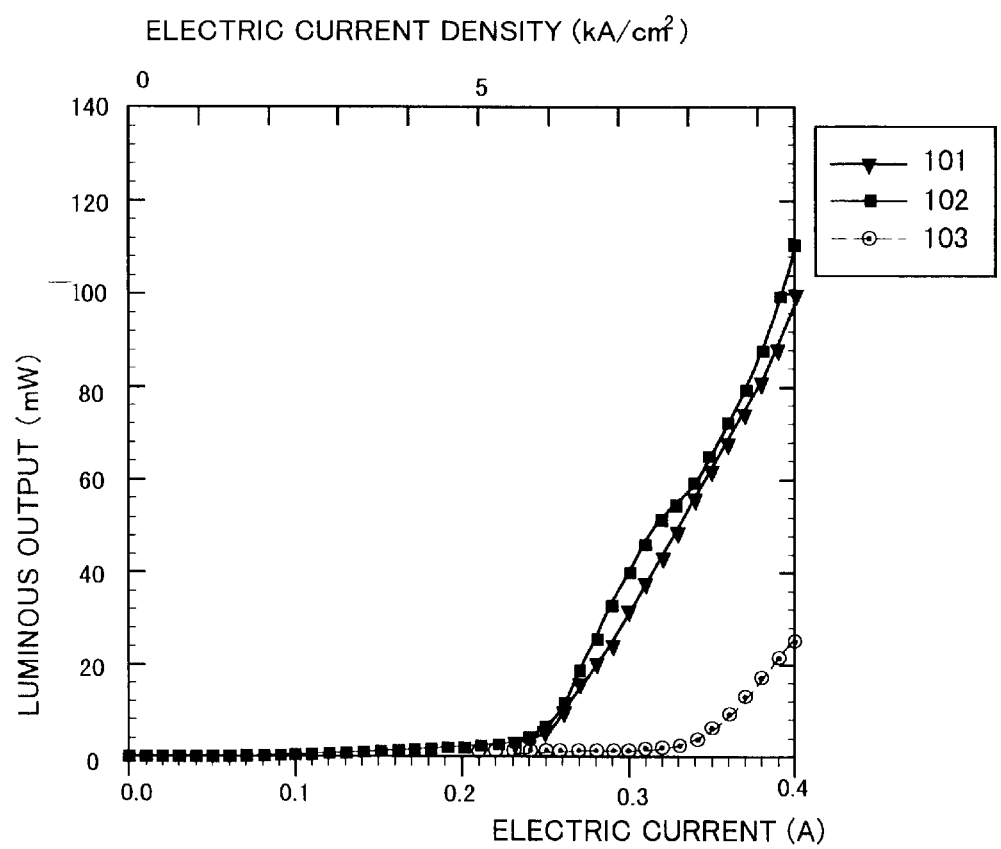
FIG. 4 is a graph showing a relationship between electric current or current density around a positive electrode and luminous output of each of the semiconductor lasers 101, 102 and 103 in the first and second embodiments of the present invention and a comparative example, respectively.
Figure 5:
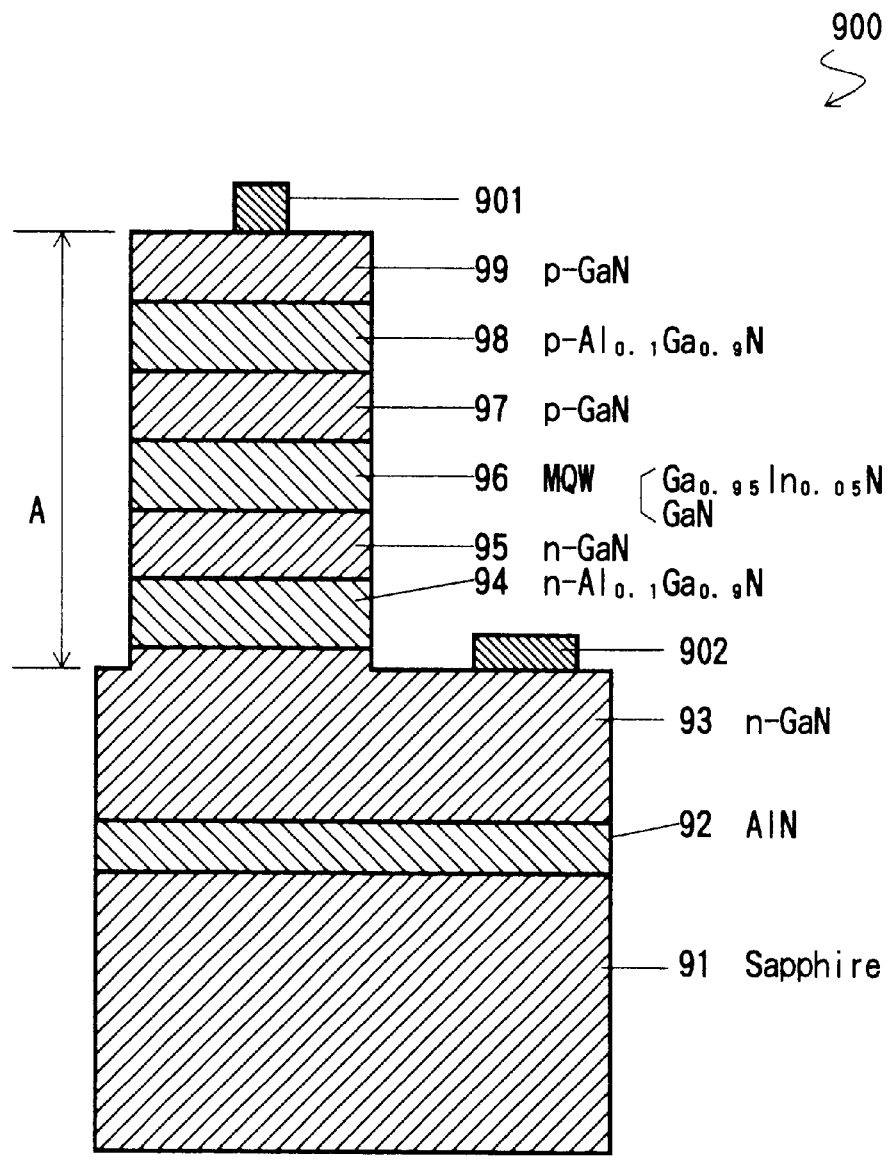
FIG. 5 is a sectional view of a conventional semiconductor laser 900.

FIG. 4 illustrates a relationship between electric current or current density in the positive electrode 10 and luminous output of the semiconductor lasers 101, 102, and 103. The laser 103 is a comparative example.

As shown in FIG. 4, in the present invention, the oscillation threshold of the current density decreases from 8 kA/cm² to 5.5 kA/cm², and the oscillation threshold of the electric current also decreases from 0.34 A to 0.23 A.

Accordingly, oscillation thresholds of both current density and electric current of the group III nitride compound semiconductor lasers 101 and 102,can be decreased efficiently. This illustrates that electric current threshold or current density threshold for laser oscillation of a ridge type of group III nitride compound semiconductor laser can be decreased efficiently when a cladding layer, which is formed in the upper portion of an resonator, is removed except the width of the electrode. Comparing the luminous outputs of the semiconductor lasers 101 and 102 in the present invention with that of the semiconductor laser 103 as a comparative example, it is clear that not the height of the ridged hole injection part B, or the depth of the first etching, but whether 50 nm of the p-cladding layer 8 is left in the ridged resonator part A as in the semiconductor laser 103 or not is important for a semiconductor laser to determine the threshold of electric current or current density for laser oscillation.

Figure 6:
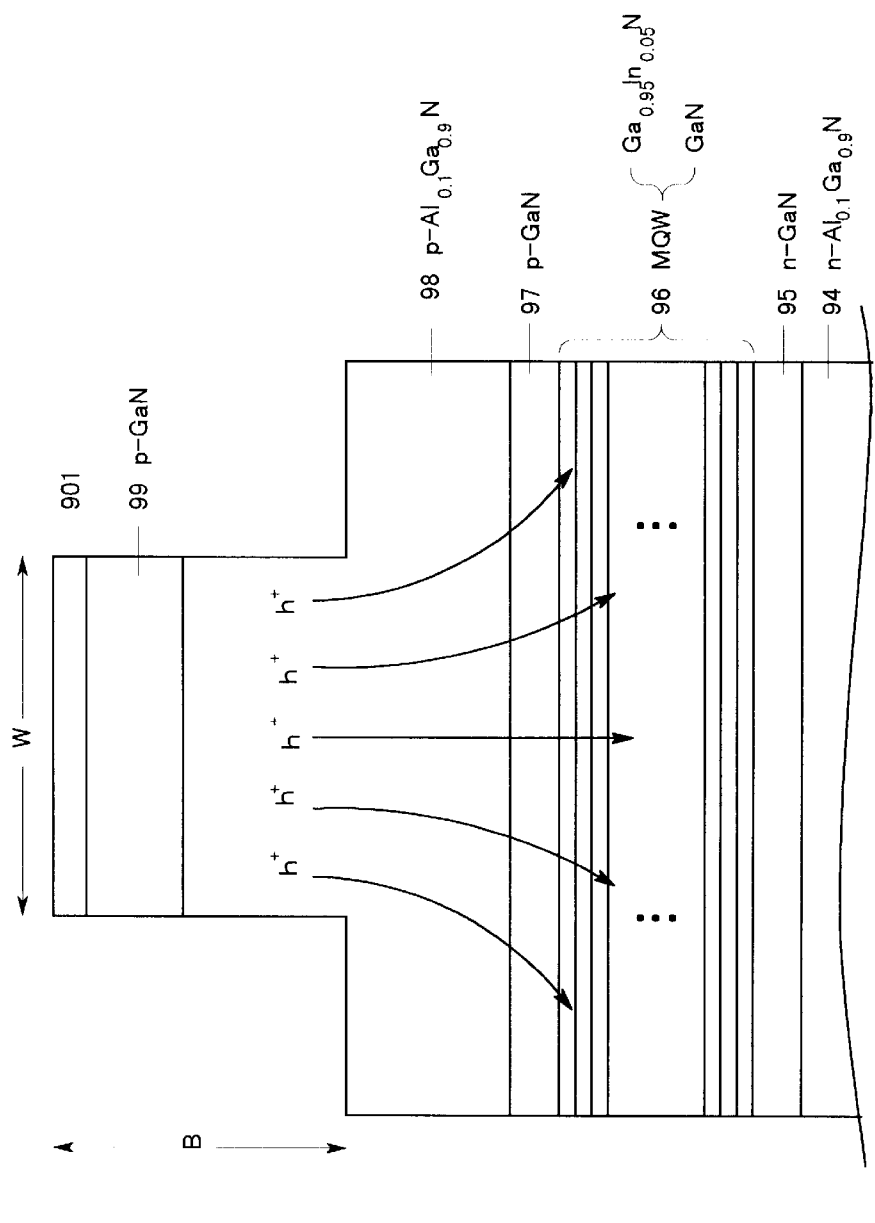
FIG. 6 is a view showing a flow of holes h+existing near a p-cladding layer of another conventional semiconductor laser.

The reason why the difference of the electric current threshold or current density threshold between the semiconductor lasers occurs is because current diffusion, or diffusion of holes, in lateral direction, which is caused in a conventional semiconductor laser as shown in FIG. 6, is limited in the semiconductor laser of the present invention and as a result current density in the active layer is increased. Another reason is because the difference of the effective refractive indices between the ridged resonator part A and the other part is increased due to increase of the current density and confinement efficiency in lateral, direction is also improved.

As described above, a ridge type of group III nitride compound semiconductor laser of the present invention, having a carrier injection part which contacts to a resonator part and is formed by removing all of a contact layer and a cladding layer and at least a portion of a guide layer except for the width corresponding to the width w of the electrode 10, has a lower electric current threshold or current density threshold for laser oscillation, compared with the conventional semiconductor laser. The main point of the present invention is to form the carrier injection part, whose area is reduced to the size of the electrode, in order not to decrease current density of carriers injected into the active layer which functions as a main layer to oscillate laser.

In the embodiments, materials to form layers 2–9 are disclosed. The layers 2–9 can be made of group III nitride compound semiconductors, and the materials and composition ratios should not be limited. Alternatively, the layers 2–9 can be made of quaternary, ternary, or binary group III nitride compound semiconductor which satisfies the formula $Al_xGa_yIn_{1-x-y}N$, ($0 \leq x \leq 1$, $0 \leq y \leq 1$, $0 \leq x+y \leq 1$), having an arbitrary composition ratio. In the embodiments, the active layer 6 has multiple quantum well (MQW) structure. Alternatively, the active layer 6 can have single quantum well (SQW) structure. Alternately, when the active layer 6 has double hetero structure, composition ratios of the active layer 6 and the cladding layers 4 and 8 can be selected so that the active layer 6 has a narrower band gap than the cladding layers 4 and 8 and the lattice constant matches. Further alternately, when a quaternary group III nitride compound semiconductor is used, band gap and lattice constant of the active layer can be varied independently and double hetero junction structure, in which lattice constant of each layers matches, can be obtained.

In the embodiments, resistivity of the p-guide layer, the p-cladding layer or the p-contact layer is lowered by irradiating electron rays. Alternatively, heat annealing, heat treatment in an atmosphere of nitrogen ($N_2$) plasma gas, or laser irradiation can be used to lower resistivity of the p-guide layer, the p-cladding layer or the p-contact layer.

In the embodiments, $SiO_2$ is used as a mask in the etching process of forming the electrode 11. Alternately, materials such as metal or resist, which is etching-proof for dry etching and which can etch or exfoliate the group III nitride compound semiconductor layer existing beneath the mask selectively, can be applied.

With respect to the region where resonator part is not formed, it does not essentially contradict the present invention when a portion of the p-contact layer, a portion of the p-cladding layer or the p-guide layer is left without being etched.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A group III nitride compound semiconductor laser with a ridged resonator part, comprising:

an active layer which functions as a main layer to oscillate said laser;

first and second guide layers contacting to said active layer;

a cladding layer which contacts a surface of said first guide layer which is opposite to said active layer;

a contact layer which contacts a surface of said cladding layer which is opposite to said first guide layer;

an electrode formed on said contact layer; and, a ridged carrier injection part contacting to said ridged resonator part, and having a width less than that of said ridged resonator part, and comprising an area of said contact layer and said cladding layer corresponding to the width of said electrode.

2. A group III nitride compound semiconductor laser with a ridged resonator part, comprising:

an active layer which functions as a main layer to oscillate said laser;

first and second guide layers contacting to said active layer;

a cladding layer which contacts a surface of said first guide layer which is opposite to said active layer;

a contact layer which contacts a surface of said cladding layer which is opposite to said first guide layer;

an electrode formed on said contact layer; and, a ridged carrier injection part is formed contacting to said ridged resonator part, and having a width less than that of said ridged resonator part, and comprising an area of said contact layer and said cladding layer and at least a partial depth of said first guide layer corresponding to the width of said electrode.

3. A group III nitride compound semiconductor laser according to claim 1, wherein said electrode is a positive electrode.

4. A group III nitride compound semiconductor laser according to claim 2, wherein said electrode is a positive electrode.

5. A group III nitride compound semiconductor laser according to claim 1, further comprising:

a second cladding layer which contacts to an opposite surface of said second guide layer to said active layer;

a second contact layer which contacts to an opposite surface of said second cladding layer to said second guide layer, and wherein said ridged resonator part comprises a portion of said second contact layer.

6. A group III nitride compound semiconductor laser according to claim 5, wherein said ridged resonator part further comprises said first guide layer, said active layer, said second guide layer and said second cladding layer.

7. A group III nitride compound semiconductor laser according to claim 2, further comprising;

a second cladding layer which contacts to an opposite surface of said second guide layer to said active layer;

a second contact layer which contacts to an opposite surface of said second cladding layer to said second guide layer, and wherein said ridged resonator part comprises a portion of said second contact layer.

8. A group III nitride compound semiconductor laser according to claim 7, wherein said ridged resonator part further comprises a remainder of said first guide layer which is not included in said ridged carrier injection part, said active layer, said second guide layer and said second cladding layer.

9. A group III nitride compound semiconductor laser according to claim 1, wherein said cladding layer has a uniform width which is less than a width of said active layer.

10. A group III nitride compound semiconductor laser according to claim 1, wherein said ridged carrier injection part includes all of said cladding layer.

11. A group III nitride compound semiconductor laser comprising:

an active layer which functions as a main layer to oscillate said laser;

first and second guide layers, said first guide layer contacting a first side of said active layer;

first and second cladding layers, said first cladding layer contacting a side of said first guide layer opposite to said active layer;

first and second contact layers, said first contact layer contacting a side of said first cladding layer opposite to said first guide layer; and first and second electrodes, said first electrode formed on said first contact layer, wherein said laser comprises a ridged type laser and said first contact layer and said first cladding layer each have a width which is the same as a width of said first electrode, wherein said first guide layer has as first portion having a width which is equal to a width of said first electrode and a second portion having a width which is greater than a width of said first electrode.

12. The group III nitride compound semiconductor laser according to claim 11, wherein said first guide layer has a width greater than a width of said first electrode.

13. The group III nitride compound semiconductor laser according to claim 11, wherein said active layer has a width greater than a width of said first electrode.

14. The group III nitride compound semiconductor laser according to claim 11, wherein said first electrode, said first contact layer and said first cladding layer form a carrier injection portion of said laser.

15. The group III nitride compound semiconductor laser according to claim 11, wherein said first electrode, said first contact layer, said first cladding layer, and a portion of said first guide layer form a carrier injection portion of said laser.

16. The group III nitride compound semiconductor laser according to claim 11, wherein said second guide layer contacts a second side of said active layer, opposite to said first side of said active layer, said second cladding layer contacts a side of said second guide layer opposite to said active layer, said second contact layer contacts a side of said second cladding layer opposite to said second guide layer, and said second electrode is formed on said second contact layer.

17. The group III nitride compound semiconductor laser according to claim 16, wherein said first guide layer, said active layer, said second guide layer and said second cladding layer form a resonator portion of said laser.

18. The group III nitride compound semiconductor laser according to claim 16, wherein a portion of said first guide layer, said active layer, said second guide layer and said second cladding layer form a resonator portion of said laser.

19. The group III nitride compound semiconductor laser according to claim 11, wherein said first electrode has a width of about 5 $\mu$m.

20. The group III nitride compound semiconductor laser according to claim 7, wherein said first guide layer has a thickness of about 100 nm, and said first portion of said first guide layer has a thickness of about 50 nm.

21. The group III nitride compound semiconductor laser according to claim 11, wherein said first guide layer comprises a magnesium doped GaN p-guide layer.

* * * * *

UNITED STATES PATENT AND TRADEMARK OFFICE
CERTIFICATE OF CORRECTION

PATENT NO.    : 6,680,957 B1
DATED         : January 20, 2004
INVENTOR(S)   : Masayoshi Koike et al.

It is certified that error appears in the above-identified patent and that said Letters Patent is hereby corrected as shown below:

Title page,
Item [73], should read:
-- [73] Assignee: Toyoda Gosei Co., Ltd., Aichi-ken (JP)
                  Japan Science and Technology Agency, Saitama-ken (JP) --

Column 8,
Line 50, delete "is formed"

Signed and Sealed this

Twenty-fifth Day of May, 2004

JON W. DUDAS
*Acting Director of the United States Patent and Trademark Office*